United States Patent [19]

Nathanson et al.

BEST AVAILABLE COPY

[11] 3,903,542

[45] Sept. 2, 1975

[54] SURFACE GATE-INDUCED CONDUCTIVITY MODULATED NEGATIVE RESISTANCE SEMICONDUCTOR DEVICE

[75] Inventors: Harvey C. Nathanson, Pittsburgh, Pa.; David Green, Corning, N.Y.; John R. Davis, Jr., Export, Pa.

[73] Assignee: Westinghouse Electric Corporation, Pittsburgh, Pa.

[22] Filed: Mar. 11, 1974

[21] Appl. No.: 450,277

[52] U.S. Cl. ...................... 357/21; 357/23; 357/24; 357/57

[51] Int. Cl.$^2$ ..................... H01L 29/74; H01L 29/78; H01L 29/66

[58] Field of Search .................... 357/21, 23, 24, 57

[56] References Cited

UNITED STATES PATENTS 3,766,372 10/1973 Kataoka et al. ........................ 357/57

*Primary Examiner*—Michael J. Lynch
*Assistant Examiner*—E. Wojciechowicz
*Attorney, Agent, or Firm*—C. L. Menzemer

[57] ABSTRACT

A surface gate-induced semiconductor device is provided which exhibits conductivity modulated transient negative resistance. First and second base electrodes are spaced from each other and make ohmic contact to a semiconductor body adjacent a major surface thereof. An insulator layer with a gate electrode thereon is positioned on a major surface of the semiconductor body between the base electrodes. A gate bias voltage is applied to the gate electrode to form an inversion layer in the semiconductor body at the major surface adjacent the gate electrode. The modulation control signal is also applied to the gate electrode to inject minority carriers from the inversion layer into the semiconductor body and conductivity modulate an electric field applied across the body between the base electrodes by an interbase voltage source. The device is characterized by an operational parameter $h^{-1}$ greater than 1 and preferably greater than 3. The semiconductor devices can be utilized in a spaced parallel array, preferably with common base electrodes, to form a neuristor device capable of propagating a minority carrier traveling wave without attenuation.

10 Claims, 10 Drawing Figures

INVENTION

SURFACE GATE-INDUCED CONDUCTIVITY MODULATED NEGATIVE RESISTANCE SEMICONDUCTOR DEVICE

FIELD OF THE INVENTION

The present invention relates to semiconductor devices and particularly conductivity modulated negative resistance semiconductor devices.

BACKGROUND OF THE INVENTION

The most common conductivity modulated negative resistance device is a double-base diode, see Lesk and Mathis, 1953 I.R.E. Convention Record, Part 6, pp. 2–8; Suran, Electronics, 28 (March 1955), pp. 198–202; Scharfetter and Jordan, I.R.E. Trans. ED 9 (November 1962), pp. 461–473. The structure of a typical double-base diode is shown in FIG. 1.

A double-base diode consists of a PN junction 3 formed in a semiconductor body 2 with two ohmic base electrodes 4 and 5 positioned at opposite ends of the body. An interbase voltage 6 and a gate voltage 7 are applied between the electrodes so that the voltage drop across the PN junction 3 varies with distance along the junction. If a suitable interbase bias is applied, part of the junction is forward bias so that, on input from a control signal source 8, minority carriers are injected into the base and swept away from the junction by the interbase field. The resulting conductivity modulation of the base causes the voltage across the junction to decrease, while the junction current is increasing, so that the PN junction exhibits a large, stable negative resistance with respect to the negatively biased base electrode. Similarly, the double-base diode can be made to operate in a transient mode by the use of an external capacitor as described fully in the above-cited references.

Double-base diodes have found application in relaxation oscillators, regenerative pulse amplifiers and switches. Most recently, attenuationless signal propagation has been achieved with a series of double-base diodes. positioned in a parallel array in the same semiconductor within a minority carrier diffusion length of each other. Separate capacitors are connected to the emitters of the diodes and are discharged through the diodes forming negative resistance transients. Since the PN junctions of the diodes are within a minority carrier diffusion length of each other, minority carriers are injected into the bases of adjacent diodes to modulate the base resistances of those diodes and trigger capacitor discharge through the emitter of those diodes. This device, called a "neuristor", thus provides minority carrier pulse propagation without attenuation and with threshhold and refractory properties so that logic circuits can be made. See, e.g., Crane, Proc. I.R.E. 50 (October 1962), pp. 2048–2060; and Mattson, Proc. I.E.E.E. (Corres.) (May 1964), p. 168.

A great difficulty with such neuristor devices is the separate external circuitry involved at each double-base diode. Not only is a separate capacitor required, but also resistors are needed between the bases of adjacent diodes to establish quiescent junction bias and provide a recharge path for the capacitors. The resistance of the recharge resistor multiplied by the capacitance of the capacitor determines in essence the refractory period of the neuristor.

The present invention overcomes these disadvantages and difficulties of the prior devices. It provides a conductivity modulated negative resistance semiconductor device of simplified construction and improved performance, a semiconductor device which can provide the same electrical characteristics as a double-base diode in transient negative resistance modes of operation. It also provides a neuristor device of smaller size and without utilization of any external capacitors or resistors. A variety of new bistable and monstable devices such as shift registers can in addition be fabricated with the present invention.

SUMMARY OF THE INVENTION

A surface gate-induced semiconductor device is provided which induces conductivity modulated transient negative resistance. Specifically, it has been found surprisingly that, by proper selection of parameters, sufficient charge can be stored in an inversion layer in a semiconductor body adjacent an insulated gate electrode and readily injected into the semiconductor body to conductivity modulate the gate electrode-to-base electrode voltage and cause a negative resistance transient. The device is characterized by an operational parameter $h^{-1}$ greater than 1 and preferably greater than 3.

The semiconductor device is comprised of a semiconductor structure comprising a semiconductor body having at least one major surface, first and second base electrodes of electrically conductive material spaced from each other adjacent said major surface and making ohmic contact to the semiconductor body, an insulator layer of electrically insulating material with a thickness greater than about 100 A. positioned on the major surface of the body at least between the base electrodes, and a gate electrode of electrically conductive material positioned on the insulator layer at least between the base electrodes.

Electrically connected to the gate electrode is a surface gate bias source to form an inversion layer in the semiconductor body at the major surface adjacent the gate electrode. Also electrically connected to the gate electrode is a control modulation source capable of modulating the bias on the gate electrode to inject carriers from the inversion layer into the semiconductor body to cause conductivity modulation. In the semiconductor body, the minority carriers trigger a negative resistance transient under the influence of an electric field formed between the base electrodes by an interbase bias source electrically connected to the first base electrode.

The semiconductor structure, interbase bias source and surface gate bias source have such dimensions and properties that $h^{-1}$ is greater than 1 and preferably greater than 3 where:

$$h^{-1} = \frac{V\epsilon}{dWqN}$$

where

- V is the voltage in volts between the gate electrode and the second base electrode;
- $\epsilon$ is the dielectric constant in farads per centimeter of the insulator layer;
- $d$ is the distance in centimeters between the gate electrode and the second base electrode;
- W is the thickness in centimeters of the insulator layer at the gate electrode;
- $q$ is the carrier charge $1.6 \times 10^{-19}$ coulombs; and N is the impurity concentration in per cubic centimeters in the semiconductor body at a region defined by $d$.

The resulting surface gate-induced conductivity modulated semiconductor device is capable of providing the same negative resistance characteristics as a double-base diode operated in a transient mode. However, the surface gate semiconductor device has several advantages over the double-base diode: (i) No diffusions are needed in the formation of the basic structure so that high minority carrier lifetimes can be attained in the body and in turn conductivity modulation in the body-base can be increased. (ii) Since no diffusions are needed to form the basic structure, the device can be made of materials, such as III–V compounds, where diffusions are difficult to control so that devices with new and improved electrical characteristics can be obtained. (iii) The simplicity of the structure permits small area devices to be made which can be readily interconnected.

The primary application for the invention is contemplated to be in attenuationless propagation of electrical signals with a neuristor device. A truly distributed propagating structure is possible since separate external resistors and capacitors are not needed. Shift registers as well as a variety of new bistable and monostable devices can thus be made by the present invention.

The neuristor device is provided by a plurality of semiconductor structures, as above described, in a substantially parallel array in and adjacent the same semiconductor body. The gate electrodes are spaced so that surface areas of the major surface adjacent the gate electrodes are spaced less than a minority carrier diffusion length apart. Preferably, the first base electrodes and second base electrodes of at least some of the semiconductor structures are common to each other so the interbase bias source is applied commonly to said base electrodes. The gate electrodes of at least some of the semiconductor structures are also preferably ohmically connected. In addition, it is preferred that a diode is formed in the semiconductor body adjacent the major surface spaced from but within minority carrier diffusion length of surface areas of the major surface adjacent a gate electrode of at least one of said semiconductor structures. The diode may be utilized in forward bias to initiate a minority carrier signal for propagation through the neuristor line, or in reverse bias to sense a traveling signal as it passes the diode along the neuristor line.

Other details, objects and advantages of the invention become apparent as the following description of the presently preferred embodiments thereof and the presently preferred methods for making and practicing the same proceeds.

BRIEF DESCRIPTION OF THE DRAWINGS

In the accompanying drawings, the presently preferred embodiments of the invention and the presently preferred methods for making and practicing the same are shown, in which.

DESCRIPTION OF THE PREFERRED EMBODIMENTS

Figure 1:
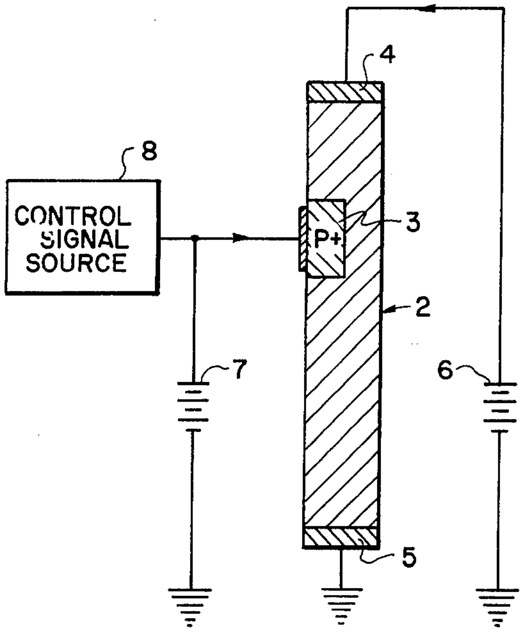
Fig. 1 PRIOR ART
FIG. 1 is a cross-sectional view in elevation of a prior art double-base diode.

Referring to FIG. 1, a prior art double-base diode is shown for purposes of comparative illustration. Further discussion of this prior art device can be found by reference to the "Background of the Invention".

Figure 2:
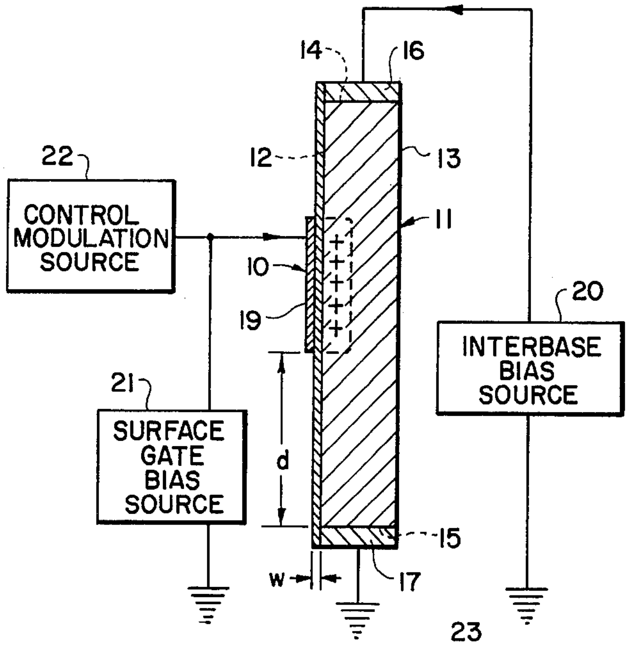
FIG. 2 is a cross-sectional view in elevation, with portions shown schematically, of a surface gate-induced conductivity modulated negative resistance semiconductor device of the present invention.

Referring to FIG. 2, a surface gate-induced conductivity modulated negative resistance semiconductor device of the present invention is shown. The device has a semiconductor structure 10 comprised of a semiconductor body 11 having opposed major surfaces 12 and 13 and opposed side surfaces 14 and 15. Body 10, which is typically a commercially available silicon wafer, has an N-type conductivity of a certain resistivity, typically between 1 and 100 ohm-cm, selected in relation to other parameters of the semiconductor device as hereinafter described.

The first and second base electrodes 16 and 17 of electrically conductive material, such as gold, silver, platinum, aluminum, chromium, tin or nickel, are spaced apart from each other on opposed side surfaces 14 and 15 to make ohmic contact with semiconductor body 11 adjacent major surface 12. Base electrodes 16 and 17 are preferably deposited by vapor or sputter deposition of a suitable metal by a standard technique over the surfaces of semiconductor body 11, and thereafter selectively removing unwanted metal from major surfaces 12 and 13 by standard photolithographic and etch techniques. The thickness of base electrodes 16 and 17 is typically between 500 and 1000 A.

Thereafter insulator layer 18 of an electrically insulating material, such as silicon dioxide ($SiO_2$) or silicon nitride ($Si_3N_4$), of greater than about 100 A. in thickness is deposited on major surface 12 of semiconductor body 11. The insulator layer is selected to provide a given dielectric constant ($\epsilon$) and thickness (W) greater than 100 A. according to the desired parameters as hereinafter described. Typical values for the dielectric constant ($\epsilon$) are 3.8 farads/cm (for silicon dioxide) or 8.5 farads/cm (for silicon nitride), and typical values for the thickness (W) are between 100 and 1000 A.

Insulator layer 18 may be formed by vapor or sputter deposition of silicon nitride, silicon dioxide or silicon monoxide in oxygen. However, the insulator layer is typically formed by thermal growth by heating the body in an oxygen-rich atmosphere to form silicon dioxide. Similarly silicon nitride may be grown on the surface by heating the semiconductor body in a silane-nitrogen atmosphere.

Gate electrode 19 of an electrically conductive material, such as gold, silver, platinum, aluminum, chromium, tin or nickel, is then deposited on insulator layer 18 in selected areas. The deposition of gate electrode 19 is preferably performed by vapor or sputter deposition of the metal through a suitable metallic mask. Alternatively, gate electrode 19 may be formed by indiscriminate vapor or sputter deposition of the metal over the entire surface of insulator layer 18 and thereafter selective removal of unwanted metal from the insulator layer with standard photolithographic and etch techniques.

The important parameter in placement of gate electrode 18 is the distance (d) from gate electrode 19 and second base electrode 17. Typical values for the distance (d) are between 5 and 200 microns.

Electrically connected to the first base electrode 16 is interbase bias source 20 to provide a given voltage drop across the semiconductor body 11 between first base electrode 16 and second base electrode 17. Bias source 20 may be simply a battery connected to ground as shown, and second electrode 17 connected to ground as shown. Bias source 20 provides voltage ($V_B$), which is selected to provide the operational parameter $h^{-1}$ in relation with other parameters of the device as hereinafter described. Typical values for voltage ($V_B$) are between 10 and 100 volts.

Electrically connected tc gate electrode 19 is surface gate bias source 21 to provide an inversion layer in semiconductor body 11 at major surface 12 adjacent gate electrode 19. Bias source 21 may be simply a lead connected to ground so that the desired bias voltage ($V_G$) applied to gate electrode 19 is provided via the division of the voltage drop across body 11 produced by interbase bias source 20. Alternatively, surface gate bias source 21 may be a battery with a given bias voltage ($V_G$), which in combination with the interbase bias source 21 provides the bias voltage. In either embodiment, the gate bias source 21 is capable of providing a given voltage drop (V) between gate electrode 19 and second base electrode 17 and is capable of forming an inversion layer in semiconductor body 11 at major surface 12 adjacent gate electrode 19. Typical values for the voltage parameter (V) is between 5 and 50 volts.

Also electrically connected to gate electrode 19 is control modulation source 22. Modulation source 22 may provide any suitable modulating control signal capable of modulating the bias on gate electrode 19 to inject carriers from the inversion layer into semiconductor body 11 to cause conductivity modulation and trigger a negative resistance transient. Typically, the amplitude of the modulation control signal is at least about 100–200 millivolts.

To provide for the operation of the present invention, operational parameter $h^{-1}$ must be greater than 1 and preferably greater than 3. This operational parameter provides that the dimensions and properties of the semiconductor structure 10 and that the voltages of the interbase bias source 20 and the surface gate bias source 21 must be selected according to the relationship:

$$h^{-1} = \frac{V\epsilon}{dWqN}$$

where

V is the voltage in volts between gate electrode 19 and second base electrode 17;

$\epsilon$ is the dielectric constant in farads per centimeter of insulator layer 18;

$d$ is the distance in centimeters between gate electrode 19 and second base electrode 17;

W is the thickness in centimeters of insulator layer 18;

$q$ is the carrier charge $1.6 \times 10^{-19}$ coulombs; and

N is the impurity concentration in per cubic centimeters in semiconductor body 10 at a region defined by $d$.

The importance of the operational parameter $h^{-1}$ shall be described in greater detail hereinafter. Other embodiments of the invention, utilizing particularly a neuristor structure, are first described by reference to FIGS. 3 through 6.

Figure 3:
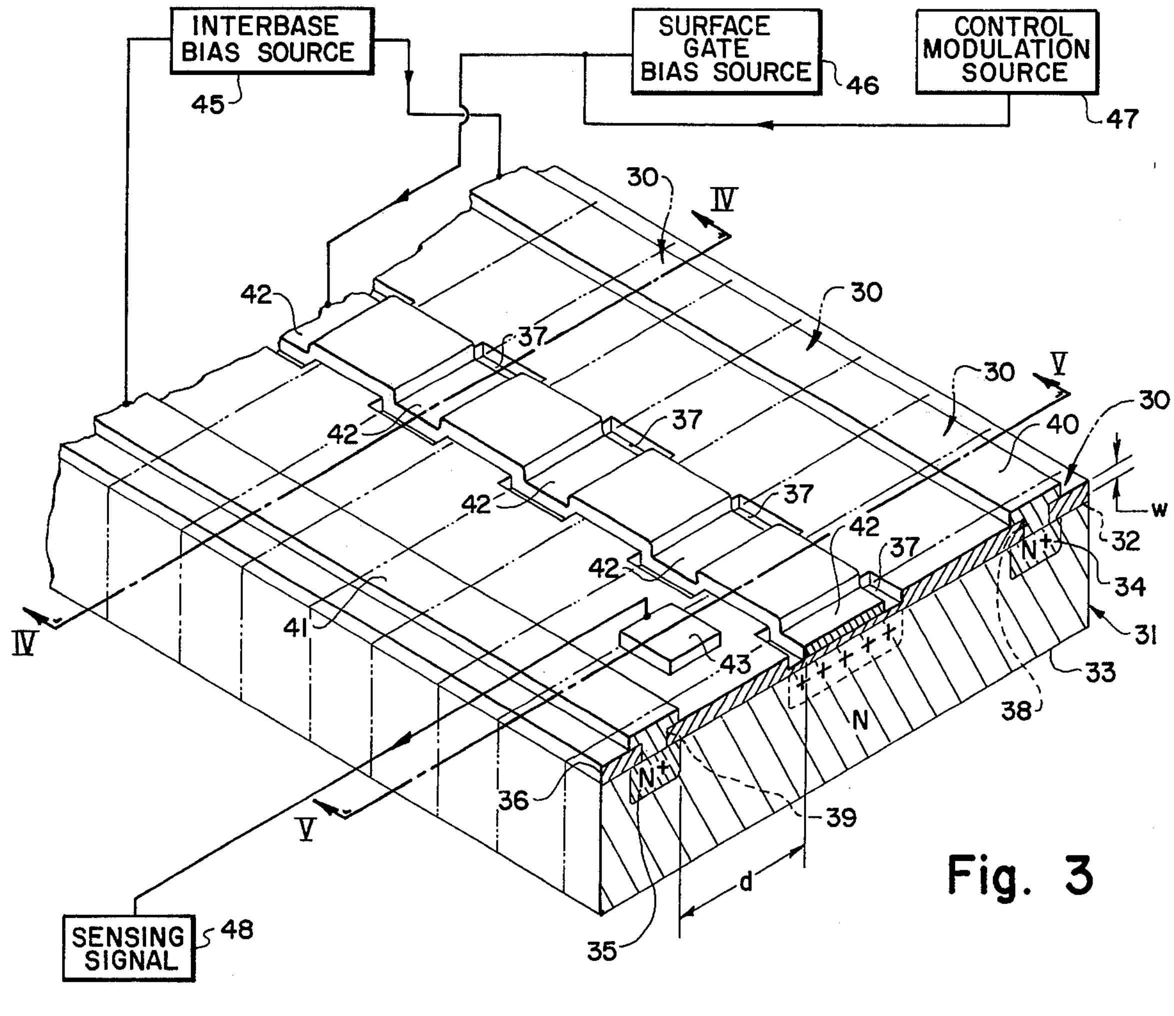
FIG. 3 is a perspective view, with portions shown schematically, of a second surface gate-induced conductivity modulated negative resistance semiconductor device embodying the present invention.
Figure 4:
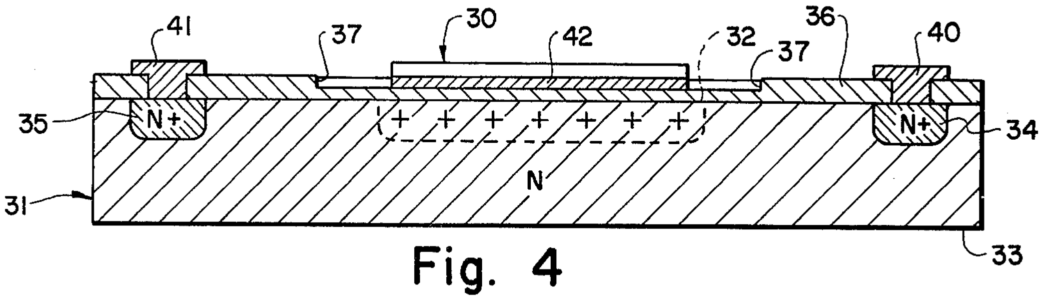
FIG. 4 is a cross-sectional view in elevation of the semiconductor device of FIG. 3 taken along line IV—IV of FIG. 3.
Figure 5:
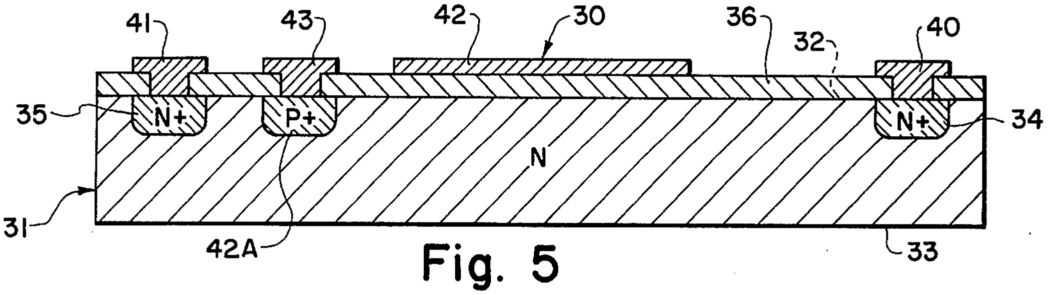
FIG. 5 is a cross-sectional view in elevation of the semiconductor device of FIG. 3 taken along line V—V of FIG. 3.

Referring to FIGS. 3, 4 and 5, a second surface gate-induced conductivity modulated negative resistance semiconductor device is shown in which a plurality of semiconductor structures 30 are positioned in substantially parallel array in semiconductor body 31. Semiconductor body 31 is typically a commercially available N-type silicon wafer having a resistivity between 10 and 100 ohm-cm and having opposed major surfaces 32 and 33.

The semiconductor structures 30 are formed by selectively diffusing into the body 31 N+ impurity regions 34 and 35 to provide base electrodes for ohmic contact to body 31. N+ impurity regions 34 and 35 are elongated channels spaced apart substantially parallel to each other adjoining major surface 32. Typical spacings between N+ impurity regions 34 and 35 are between 10 and 400 microns. The diffusion is preferably accomplished utilizing standard diffusion and photolithographic and etching techniques.

Before or after diffusion of N+ impurity regions 34 and 35, insulator layer 36 of electrically insulating material, such as silicon dioxide ($SiO_2$) or silicon nitride ($Si_3N_4$), of greater than about 100 A. in thickness is deposited on major surface 32 of semiconductor body 31. Insulator layer 36 is selected to provide a given dielectric constant ($\epsilon$) consonant with the desired value for the operational parameter $h^{-1}$ as hereinafter more fully described, and to provide a thickness much greater (i.e. typically 5 times greater) than the thickness of the insulator layer desired at the gate of the semiconductor device. Typical values for the dielectric constant ($\epsilon$) are 3.8 farads/cm (for silicon dioxide) or 8.5 farads/cm (for silicon nitride), and typical values for the thickness is at least about 5,000 A.

Insulator layer 36 may be formed by vapor or sputter deposition of silicon nitride, silicon dioxide or silicon monoxide in oxygen. However, the insulator layer is typically formed by thermal growth by heating the body in an oxygen-rich atmosphere to form silicon dioxide. Similarly, silicon nitride may be grown on the surface by heating the semiconductor body in a silane-nitrogen atmosphere.

Wells 37, and windows 38 and 39 are then formed in insulator layer 36. Windows 38 and 39 are preferably first opened by standard photolithographic and etch techniques to expose portions of major surface 32 adjoining N+ impurity regions 34 and 35 to provide for completion of the base electrodes for semiconductor structures 30 as hereinafter described. Wells 37 are then preferably formed in insulator layer 36 spaced between windows 38 and 39 and spaced from each other less than a minority carrier diffusion length in semiconductor body 31.

Wells 37 are preferably formed by a precision photolithographic and etch technique so that the thickness of insulator layer 36 can be carefully controlled at the base of wells 37. Thus, insulator layer 36 at wells 37 is a thickness (W) greater than 100 A. as determined by the desired value for the operational parameter $h^{-1}$ and the other parameters of the semiconductor device as hereinafter described. Again, typical values for the thickness of the insulator layer 36 at the base of the wells 37 is between 100 and 1000 A.

Thereafter, first and second base electrodes 40 and 41 are completed and gate electrodes 42 are formed for semiconductor structures 30. Base electrodes 40 and 41 thus make ohmic contact to body 31 by N+ impurity regions 34 and 35 that are common to a plurality of semiconductor structures 30. Gate electrodes 42 are similarly formed at the wells 37 in insulator layer 36 and are ohmically connected over the thick portion of insulator layer 36 between wells 37. The thickness of the electrodes thus formed is typically between 500 and 1000 A.

Again it should be noted that the important parameter in placement of the electrodes is the distance (d) between gate electrodes 42 and second base electrode 41 at the boundary of N+ impurity region 35. Again typical values for distance (d) are between 5 and 200 microns.

Also preferably formed in semiconductor body 31 concurrently with semiconductor structures 30 is diode 42A. Diode 42A is positioned within a minority carrier diffusion length in semiconductor body 31 of at least one semiconductor structure 30. The diode is preferably made by diffusion of a P+ impurity into semiconductor body 31 adjoining major surface 32 to form a PN junction with the residual doping originally grown in semiconductor body 31 as shown in FIG. 5.

The P+ impurity region may be grown before or after formation of insulator layer 36. Preferably diode 42A is diffused after deposition or growth of insulator layer 36 so that the insulator layer is utilized as the deposition mask. Thus, P+ impurity region is formed by opening a suitable window in insulator layer 36 and causing the diffusion prior to formation of wells 37 and windows 38 and 39. The gate contact 43 to diode 42A can thereafter be made through the window used for diffusion of the P+ impurity region and may be formed simultaneously with the formation of electrodes 40, 41 and 42.

Electrically connected to first base electrode 40 is interbase bias source 45 to provide a given voltage drop across the semiconductor body 11 between first base electrode 40 and second base electrode 41. Bias source 45 may be simply a battery connected to ground. Bias source 45 again provides a voltage ($V_B$), which is selected to provide a desired operational parameter $h^{-1}$ in relation with other parameters of the device as hereinafter described. Typical values for voltage ($V_B$) are between 10 and 100 volts.

Electrically connected to gate electrode 42 is surface gate bias source 46 to provide a plurality of separate inversion layers in semiconductor body 31 at major surface 32 adjacent gate electrodes 42. Bias source 46 may be simply a lead connected to ground so that the desired parameter voltage (V) between the gate electrodes 42 and the second base electrode 41 is provided via the division of the voltage drop between base electrodes 40 and 41 produced by interbase bias source 45. Preferably, however, surface gate bias source 46 is a battery with a given voltage ($V_G$), which in combiination with the interbase bias source 45, provides the operational voltage parameter (V) between gate electrodes 42 and second base electrode 41. In either embodiment, the gate bias source 45 is capable of forming a plurality of separate inversion layers in semiconductor body 31 at major surface 32 adjacent gate electrodes 42. Typically, voltage parameter (V) is between 5 and 50 volts.

Also electrically connected to gate electrodes 42 is control modulation source 47. Modulation source 47 may provide any suitable modulating control signal capable of modulating the bias on the gate electrode to inject carriers from inversion layer into semiconductor body 31 to cause conductivity modulation. That is, the injected carriers are carried away to second base electrode 41 under the influence of the electric field between first and second base electrodes 40 and 41 applied by interbase bias source 45 to trigger a transient negative resistance. Typically, the amplitude of the modulation control signal is at least 100–200 millivolts.

Again to provide for the operation of the present invention, operational parameter $h^{-1}$ must be greater than 1 and preferably greater than 3 for each semiconductor device. As above described, this operational parameter provides that the dimensions and properties of the semiconductoor structures 30, and the voltages of interbase bias source 45 and surface gate bias source 46 must be selected according to the relationship:

$$h^{-1} = \frac{V\epsilon}{dWqN}$$

The resulting device is capable of neuristor action where a minority carrier signal is successively propagated from semiconductor device to adjacent semiconductor device. Modulation of one semiconductor device triggers an adjacent semiconductor device into a negative resistance state because the surface areas of major surface 32 and the adjacent gate electrodes 42 are within a minority carrier diffusion length of each other so that minority carriers for the inversion layer are injected into the adjacent device on modulation. No external capacitors or resistors are needed for neuristor operation. The capacitance is provided by the insulator layer 36 at gate electrodes 42 and wells 37, and recharging resistance path for the capacitors is provided by the internal leakage resistance of the semiconductor body 31.

The diode 42A, which is by the arrangement a double-base diode, can be used to initiate a minority carrier propagation signal through the neuristor structure by momentarily forward biasing the diode. Diode 42A can also be reverse biased and in that state used to sense a passing propagating signal and producing sensing signal 48.

The present invention thus provides a practical neuristor structure which can be used in miniaturized electronic systems to transmit electrical signals without the resistance drop associated with wiring and usual interconnections. Further, the neuristor device can be practically utilized as, for example, a simple time delay line without propagation attenuation as, for example, is present in acoustic surface wave devices. Further, such neuristor devices can be interconnected as shown in FIG. 6 so that a complete microminiaturized digital logic can be provided solely with networks of neuristor devices.

Figure 6:
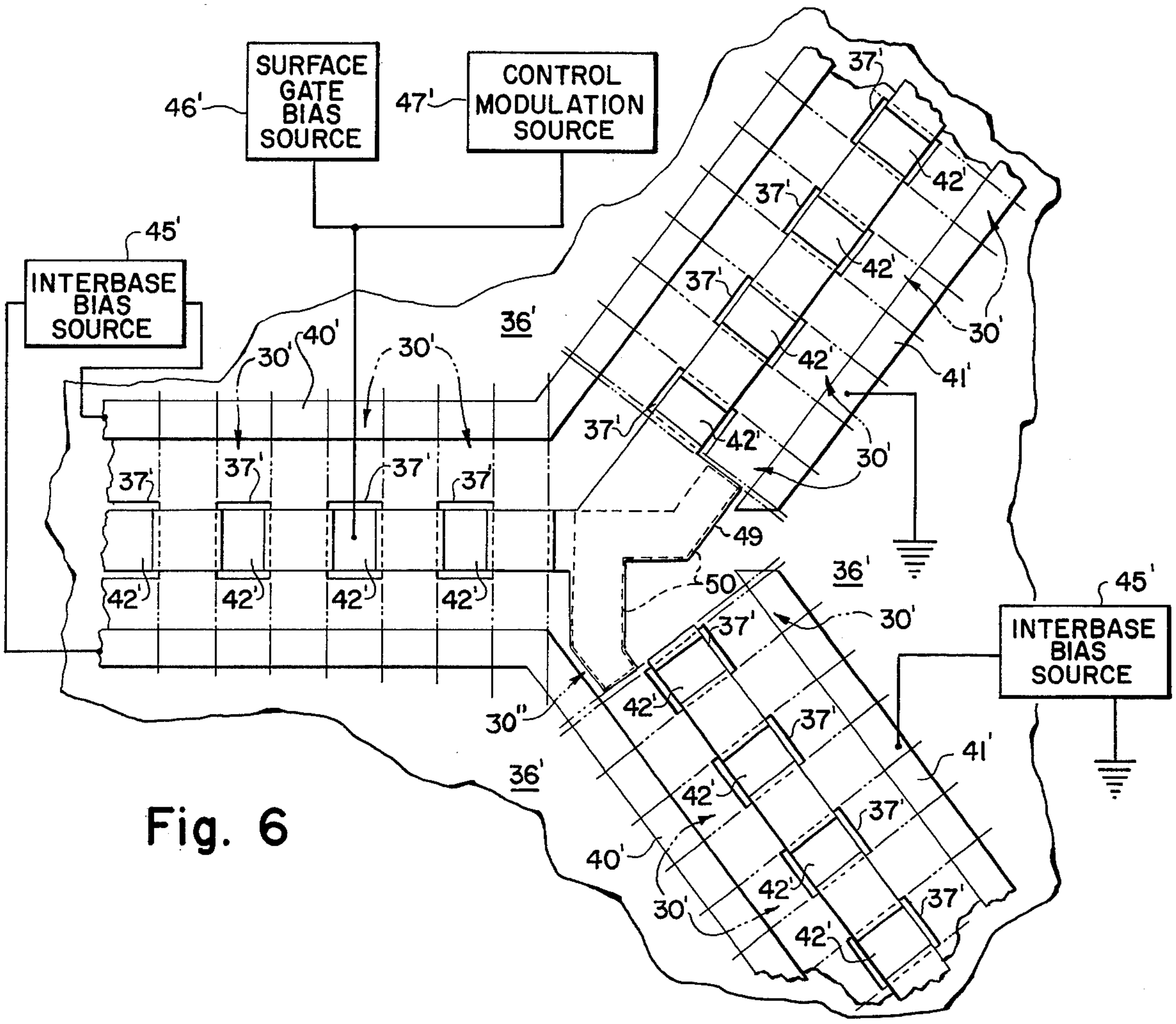
FIG. 6 is a top view of a third surface gate-induced conductivity modulated negative resistance semiconductor device embodying the present invention.

Referring to FIG. 6, the neuristor device is precisely as above described in connection with FIGS. 3, 4 and 5, except that a specially dimensioned gate electrode 49 is provided at the intercept of the neuristor lines. The incoming signal is thus able to be injected into adjacent devices of the outgoing neuristor line or lines without attenuation of the signal. It should be noted in this connection that the configuration of the inversion layer of the branching semiconductor device 30'' is determined by the shape of the well 50. If desired, a separate diode (not shown) may also be provided in communication with the inversion layer adjacent the branching gate electrode 50 to boost or increase the transmitted energy of the propagating signal.

In each of the embodiments, operational parameter $h^{-1}$ must be greater than 1 and is preferably greater than 3 in the present invention because the time constant ($\tau_{RC}$) of the semiconductor device must be greater than the transit time ($\tau_{TR}$) for the negative resistance transient and inversion regeneration to occur. $h^{-1}$ is by definition $\tau_{RC}/\tau_{TR}$. Therefore, $h^{-1}$ greater than 1 provides the condition for operation of the present invention. IF $\tau_{RC}$ is less than $\tau_{TR}$, a simply exponential RC time constant is observed, and no negative resistance transient or inversion regeneration occurs.

To understand the derivation of the relation of the parameters in terms of $h^{-1}$, it should be recognized (i) that the transit time is defined as the distance (d) between the gate electrode and the second base electrode divided by the minority carrier velocity through the semiconductor, i.e. $\tau_{TR} \equiv d/v_o$, where $v_o \equiv \mu_E$ (cm/sec), and (ii) that the time constant is defined as the resistance times the capacitance of the insulator layer, i.e. $\tau_{RC} \equiv R_o C$, where $$R_o \equiv \frac{d}{q\mu NA}.$$

The operational parameter $h^{-1}$ can thus be written in terms of the dimensions and properties of the semiconductor device as follows:

$$h^{-1} = \frac{\tau_{RC}}{\tau_{TR}} = \frac{\mu E}{d} \cdot R_o C = \frac{\mu E}{d} \cdot \frac{Cd}{q\mu NA} = \frac{EC}{qNA}$$

where

E is the electric field in the region of the semiconductor body defined by $d$;

c is the capacitance of the insulator layer;

$q$ is the charge constant of the minority carriers;

N is the impurity concentration in the semiconductor body at the region defined by $d$;

A is the cross-sectional area of the semiconductor device in the region defined by $d$; and $\mu$ is the minority carrier mobility through the semiconductor body.

This equation can be simplified by noting that $A \approx W_{si} \times t$ where W is the width of the semiconductor device (i.e. the gate electrode) and $t$ is the thickness of the semiconductor body, and that $w \approx d$ and $t \approx \frac{1}{2} d$. Thus, $A \approx \frac{1}{2} d^2$. Further, $$C = \frac{\epsilon A}{W_{ox}} = \frac{\epsilon}{W_{ox}} \cdot \frac{d^2}{2} = \frac{\epsilon d^2}{2W_{ox}} \text{ and } E = \frac{V}{d}$$

Therefore:

$$h^{-1} = \frac{EC}{qNA} = \frac{1}{qN} \cdot \frac{V}{d} \cdot \frac{\epsilon d^2}{2W} \cdot \frac{2}{d^2} = \frac{V\epsilon}{dWqN}$$

where

V is the voltage in volts between the gate electrode and the second base electrode;

$\epsilon$ is the dielectric constant in farads per centimeter of the insulator layer;

$d$ is the distance in centimeters between the gate electrode and the second base electrode;

$w$ is the thickness in centimeters of the insulator layer;

$q$ is the carrier charge constant, $1.6 \times 10^{-19}$ coulombs; and

N is the impurity concentration in per cubic centimeters in the semiconductor body at a region defined by $d$.

The importance of the operational parameter $h^{-1}$ to the present invention may be further understood by analysis of the equivalent circuit. The equivalent circuit is shown in FIG. 8.

Figure 7:
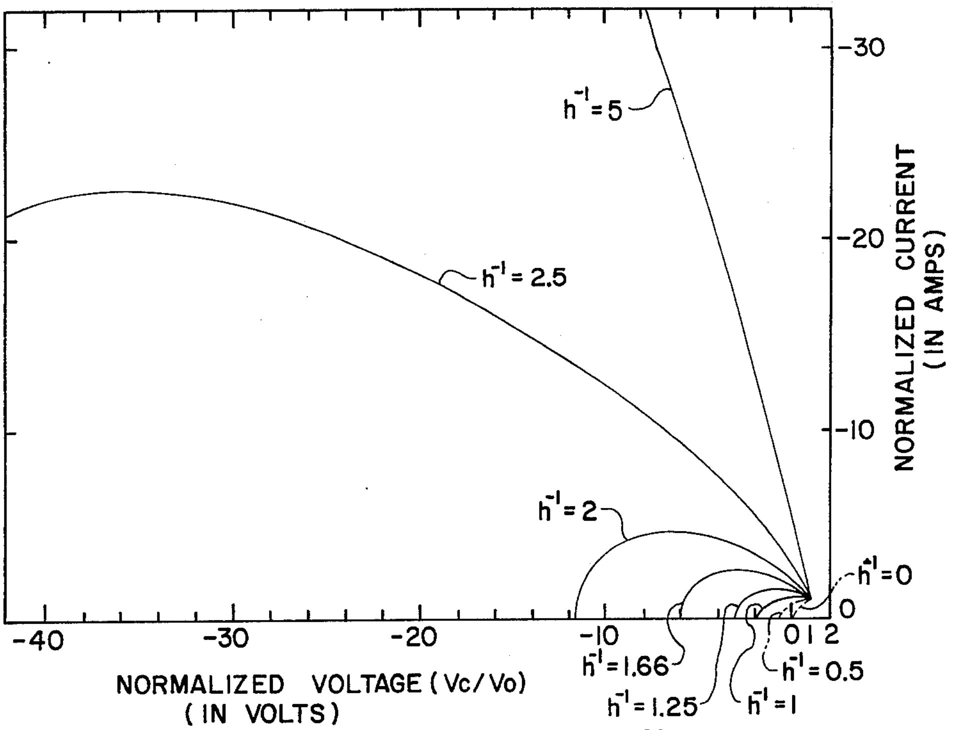
FIG. 7 is a graph showing the voltage-current response of a surface gate-induced conductivity modulated negative resistance semiconductor device of the present invention for various values of the operational parameter $h^{-1}$.

Referring to FIG. 7, the transient V–I response curve is plotted for various values of $h^{-1}$. The voltage-current function can be derived by analysis of the equivalent circuit shown in FIG. 8.

Figure 8:
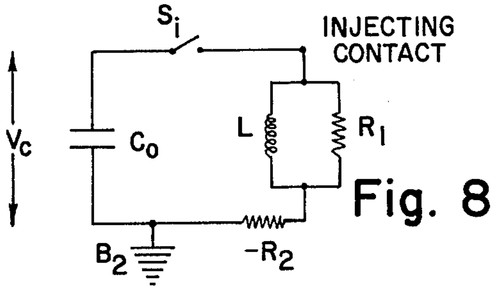
FIG. 8 is a schematic of the equivalent circuit of the surface gate-induced conductivity modulated negative resistance semiconductor device shown in FIG. 2.

Formally, writing the loop equations for the equivalent circuit shown in FIG. 8, assuming the initial capacitor voltage $V_c$ is $V_o$, is:

$$\frac{V_c}{V_o} = e^{\frac{b(b+1)R_o^2 - \frac{L}{C}}{2R_oL}} \left[ \text{Cos} \sqrt{(b+1)\frac{1}{LC} - \left[\frac{b(b+1)R_o^2 - \frac{L}{C}}{2R_oL}\right]^2}\, t \right.$$

$$\left. \frac{\frac{b(b+1)R_o^2 - \frac{L}{C}}{2R_oL} + \frac{1}{R_oC}}{\sqrt{(b+1)\frac{1}{LC} - \left[\frac{b(b+1)R_o^2 - \frac{L}{C}}{2R_oL}\right]^2}} \text{Sin} \sqrt{(h+1)\frac{1}{LC} - \left[b(b+1)R_o^2 - \frac{L}{C}\right]^2}\, t \right]$$

where $b$ is $\mu_n/\mu_p$ or the carrier mobility ratio ($\approx 2.6$);

$\mu_n$ and $\mu_p$ are the electron and hole mobilities ($cm^2$/volt-sec) respectively; and $t$ is time.

Simplifying the equation and writing in terms of the operational parameter $h$, with time (t) normalized to the transit time ($\tau_{TR}$):

$$\frac{V_c}{V_o} = e^{(1-h)\frac{t}{2\tau_{TR}}}\left[\text{Cos}\sqrt{\frac{h}{b}-\left[\frac{1-h}{2}\right]^2}\,\frac{t}{\tau_{TR}} - \frac{1+h}{2\sqrt{\frac{h}{b}-\left[\frac{1-h}{2}\right]^2}}\,\text{Sin}\sqrt{\frac{h}{b}-\left[\frac{1-h}{2}\right]^2}\,\frac{t}{\tau_{TR}}\right]$$

The graph of FIG. 7 is then derived from this equation. The discharge current of capacitance C is $$I_c = -C\,\frac{dV}{dt}.$$

Therefore FIG. 7 is obtained by differentiating the last stated equation, and plotting the loci of discharge current and voltage values for various values of $h$ or $h^{-1}$ (with $b$ equal to 2.6). The voltage and current are normalized to initial voltage drop between the gate electrode and second base electrode at the initiation of the conductivity modulation, with the initial current equal to the initial voltage divided by the resistance ($R_o$) for the ohmic condition.

From FIG. 7, it is shown that when $h^{-1} = 0$, i.e. C is very small, the transient V–I curve lies on a line of slope 1 ($R_o$). As $h^{-1}$ increases (C increasing), a finite feedback effect develops. As $h^{-1}$ increases above 1, substantial regeneration occurs. For example, when $h^{-1}=2$ (i.e. when the $\tau_{RC}$ time constant is twice $\tau_{TR}$), the capacitance voltage is depressed about 12 times below its initial positive value. This negative going depression voltage ($\Delta V_{max}$) can be normalized and the quotient considered the "gain" or amplification factor ($\Delta V_{max})/V_o$ of the semiconductor device.

Figure 9:
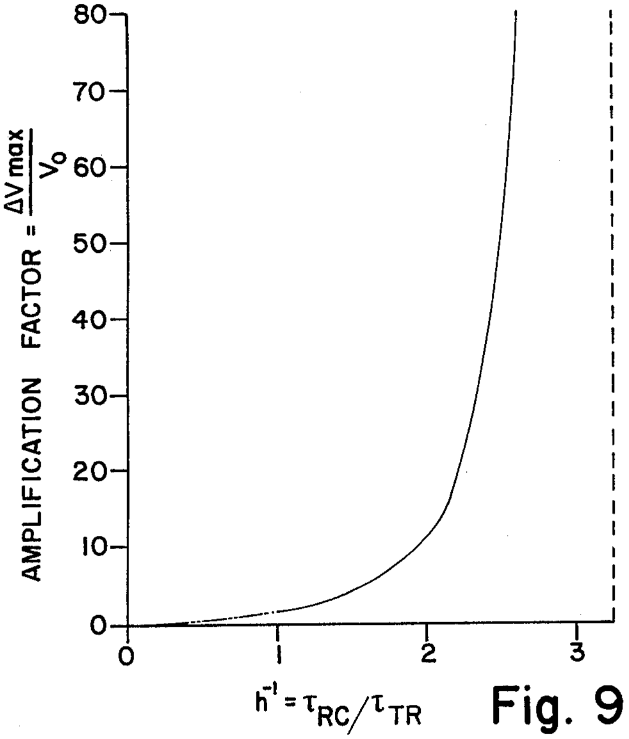
FIG. 9 is a graph showing the negative resistance response (i.e. the amplification factor) of a surface gate-induced conductivity modulated negative resistance semiconductor device of the present invention as a function of the operational parameter $h^{-1}$.

Referring then to FIG. 9, the amplification factor is plotted as a function of $h^{-1}$ (again with $b$ equal to 2.6). FIG. 9 shows that the conductivity modulated transient negative resistance commences with $h^{-1} = 1$ and reaches 10 at about $h^{-1} = 2$. At $h^{-1} = 3$, the "gain" is approximately 200 or over. If the "gain" is 200, a 10 mv modulation triggering pulse will discharge or inject 2 volts worth of inversion layer charge into the semiconductor body. Accordingly, as is preferred, very substantial negative going transient resistance is obtained for operational parameter $h^{-1}$ about 3 or more.

From the above derived relation for $h^{-1}$, it is also shown that the insulator layer should be thin, and the impurity concentration of the semiconductor be low for a relatively long time constant ($\tau_{RC}$); and the voltage parameter (V) should be large for a relatively short transit time ($\tau_{TR}$).

To illustrate the interrelation of the parameters, the semiconductor device was considered for the treshhold conductivity modulated negative resistance, i.e. $h^{-1} = 1$. The voltage (V) from the gate electrode to the second base electrode was considered at +5 volts. As shown above, the semiconductor body was assumed to be doped with N-type conductivity.

Figure 10:
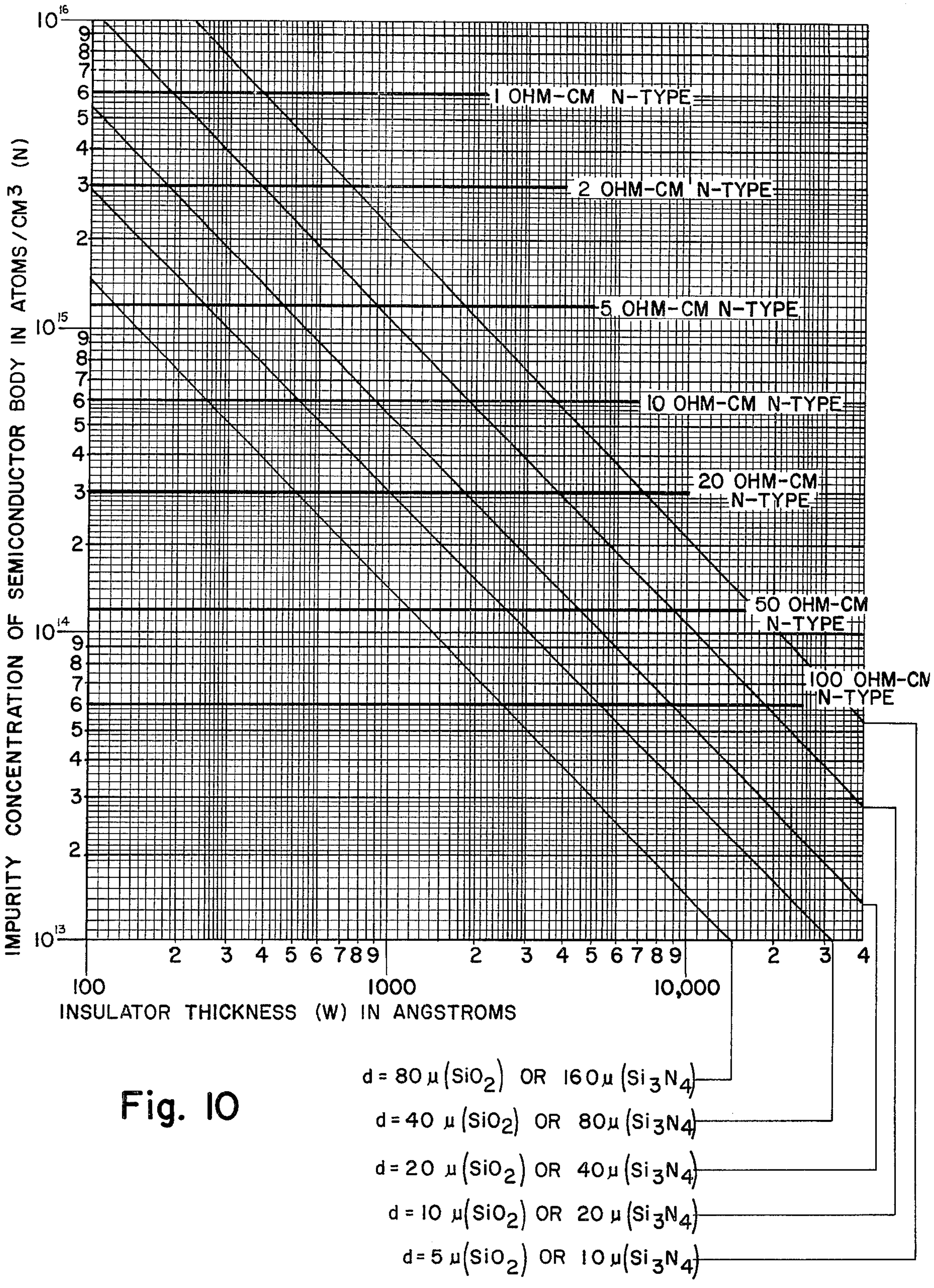
FIG. 10 is a graph showing the interrelationship of various parameters in the operation of the present invention for the threshold negative resistance transient (i.e. $h^1 = 1$) for one embodiment of the present invention.

Referring to FIG. 10, the impurity concentration of the semiconductor body is then considered as a function of the thickness of the insulator layer for various values of the gate-to-second base electrode distance (d), i.e.

$$N = \frac{V\epsilon}{qdW}.$$

FIG. 10 further assumes that the dielectric constant for silicon nitride is approximately twice the dielectric constant for silicon dioxide.

From FIG. 10, the following TABLE I is derived showing some possible combinations of body resistivity, insulator thickness and characteristic length (d).

TABLE I

Some Combinations of Material Parameters for Threshhold Conductivity Modulated Negative Resistance

| Insulator Composition | Thickness (in A) | Body Resistivity (in ohm-cm N type) | Characteristic distance (d) (in microns) |
|---|---|---|---|
| $SiO_2$ | 800 | 20 | 40 |
| $SiO_2$ | 800 | 10 | 20 |
| $Si_3N_4$ | 500 | 3 | 10 |
| $Si_3N_4$ | 500 | 10 | 80 |

Stated another way, FIG. 10 and TABLE I relate the maximum characteristic length (d) (i.e. gate electrode to second base electrode distance) to the semiconductor body resistivity and insulator layer thickness for threshhold conductivity modulated negative resistance for the present invention. Again it should be emphasized that this assumes a voltage (V) parameter of +5 volts. Moreover, it should be recognized that the unit cell width of the semiconductor device, i.e. typically the width of the electrode gate, and twice the semiconductor body thickness are on the order of the characteristic length (d), the same as the definitive relationship for $h^{-1}$ above derived shows.

The above discussion also makes clear that the operating bias potential is fixed by the potential of the inversion layer relative to the second base electrode. More importantly, the semiconductor device requires (i) that the inversion layer be entirely thermally generated and (ii) requires that regeneration or recharge time be generally much longer than the discharge time because of capacitive isolation of the gate bias by the insulator layer. For these reasons, semiconductor device of the present invention in its simplest form is capable of operating only in transient modes consistent with the time constant of its gate circuit and the thermal regeneration of the inversion layer.

To illustrate the operation of the present invention, surface gate semiconductor devices were made with gate electrodes 0.001 inch × 0.001 inch. Semiconductor body was 20 ohm-cm N-type silicon into which N+ contact regions were diffused. A P-type diode was also formed to act as a sensing electrode to monitor the operation of the device. The gate region was formed by an aluminum pad on a thin silicon nitride insulator layer.

In operation, variations in the conductivity between the first and second base electrodes indicated the formation of a deep depletion region as a negative bias was applied to the gate electrode. Thermal generation of holes then formed an inversion layer which acted as an emitter, and a corresponding reduction in the depletion layer depth was also observed. A small reduction of the gate bias on the gate electrode caused some of the holes from the inversion layer to inject into the semiconductor body. This produced a small increase in conductivity, but in these initial experimental devices the conductivity modulation was not sufficient to cause a negative resistance characteristic and injection of a large amount from the inversion charge. It was concluded that the reason for this behavior was because of a low capacitance at the insulator layer adjacent the gate electrode and that a first-order device of the present invention could be made.

While certain embodiments of the invention have been described above with particularity, it is distinctly understood that the invention may be otherwise variously embodied and used within the scope of the following claims. For example, although the description has been with respect to N-type semiconductor bodies and P-type inversion layers, the invention may be similarly embodied with P-type semiconductor bodies and N-type inversion layers.

What is claimed is:

1. A surface gate-induced conductivity modulated negative resistance semiconductor device comprising:

A. semiconductor structure comprising a semiconductor body having at least one major surface, first and second base electrodes of electrically conductive material spaced from each other adjacent said major surface and making ohmic contact to the semiconductor body, an insulator layer of electrically insulating material with a thickness greater than about 100 A. positioned on the major surface of the body at least between the base electrodes, and a gate electrode of electrically conductive material positioned on the insulator layer at least between the base electrodes;

B. an interbase bias source electrically connected to at least one base electrode and capable of applying a given voltage across the body between the first and second base electrodes;

C. a surface gate bias source electrically connected to the gate electrode and capable of forming an inversion layer in the semiconductor body at the major surface adjacent the gate electrode;

D. a control modulation source electrically connected to the gate electrode and capable of modulating the bias on the gate electrode to inject carriers from the inversion layer into the semiconductor body to cause conductivity modulation; and E. said semiconductor structure, interbase bias source and surface gate bias source being of such dimensions and properties to provide $h^{-1}$ greater than 1 where:

$$h^{-1} = \frac{V\epsilon}{dWqN}$$

where

V is the voltage in volts between the gate electrode and the second base electrode;

$\epsilon$ is the dielectric constant in farads per centimeter of the insulator layer;

$d$ is the distance in centimeters between the gate electrode and the second base electrode;

W is the thickness in centimeters of the insulator layer at the gate electrode;

$q$ is the carrier charge $1.6 \times 10^{-19}$ coulombs; and

N is the impurity concentration in per cubic centimeters in the semiconductor body at a region defined by $d$.

2. A surface gate-induced conductivity modulated negative resistance semiconductor device as set forth in claim 1 comprising in addition:

a plurality of said semiconductor structures positioned in substantially parallel array in and adjacent the same semiconductor body, with surface areas of the major surface of the semiconductor body adjacent the gate electrodes of adjacent structures spaced less than a minority carrier diffusion length apart, each said structure having an interbase bias source and a surface gate bias source connected to the base electrodes and gate electrode, respectively, thereof.

3. A surface gate-induced conductivity modulated negative resistance semiconductor device as set forth in claim 2 wherein:

the first base electrodes and the second base electrodes of at least some of the semiconductor structures are common.

4. A surface gate-induced conductivity modulated negative resistance semiconductor device as set forth in claim 3 wherein:

the gate electrodes of at least some of the semiconductor structures are ohmically connected.

5. A surface gate-induced conductivity modulated negative resistance semiconductor device as set forth in claim 2 wherein:

a diode is formed in the semiconductor body adjoining the major surface spaced from but within a minority carrier diffusion length of surface areas of the major surface adjacent a gate electrode of at least one of said semiconductor structures.

6. A surface gate-induced conductivity modulated negative resistance semiconductor device as set forth in claim 1 wherein:

$h^{-1}$ is greater than 3.

7. A surface gate-induced conductivity modulated negative resistance semiconductor device as set forth in claim 6 comprising in addition:

a plurality of said semiconductor structures positioned in substantially parallel array in and adjacent the same semiconductor body, with surface areas of the major surface of the semiconductor body adjacent the gate electrodes of adjacent structures spaced less than a minority carrier diffusion length apart, each said structure having an interbase bias source and a surface gate bias source connected to the base electrodes and gate electrode, respectively, thereof.

8. A surface gate-induced conductivity modulated negative resistance semiconductor device as set forth in claim 7 wherein:

the first base electrodes and the second base electrodes of at least some of the semiconductor structrures are common.

9. A surface gate-induced conductivity modulated negative resistance semiconductor device as set forth in claim 8 wherein:

the gate electrodes of at least some of the semiconductor structures are ohmically connected.

10. A surface gate-induced conductivity modulated negative resistance semiconductor device as set forth in claim 7 wherein:

a diode is formed in the semiconductor body adjoining the major surface spaced from but within a minority carrier diffusion length of surface areas of the major surface adjacent a gate electrode of at least one of said semiconductor structures.

* * * * *